United States Patent
Hoffmann et al.

(10) Patent No.: US 11,910,579 B2
(45) Date of Patent: Feb. 20, 2024

(54) DETERMINING THE FLOW VELOCITY IN A COOLANT CIRCUIT

(71) Applicant: Siemens Aktiengesellschaft, Munich (DE)

(72) Inventors: Ingolf Hoffmann, Herzogenaurach (DE); Horst Geyer, Erlangen (DE); Abderrahim Chahid, Hemhofen (DE)

(73) Assignee: Siemens Aktiengesellschaft, Munich (DE)

( * ) Notice: Subject to any disclaimer, the term of this patent is extended or adjusted under 35 U.S.C. 154(b) by 393 days.

(21) Appl. No.: 17/414,798

(22) PCT Filed: Nov. 25, 2019

(86) PCT No.: PCT/EP2019/082426
§ 371 (c)(1),
(2) Date: Jun. 16, 2021

(87) PCT Pub. No.: WO2020/126330
PCT Pub. Date: Jun. 25, 2020

(65) Prior Publication Data
US 2022/0022345 A1    Jan. 20, 2022

(30) Foreign Application Priority Data

Dec. 17, 2018 (EP) ..................... 18213067

(51) Int. Cl.
*H05K 7/20* (2006.01)
*G01F 1/69* (2006.01)

(52) U.S. Cl.
CPC ........... *H05K 7/20927* (2013.01); *G01F 1/69* (2013.01); *H05K 7/20945* (2013.01)

(58) Field of Classification Search
CPC .. H05K 7/20927; H05K 7/20945; G01F 1/69; H02H 7/12; H02H 5/04; H02M 1/32
See application file for complete search history.

(56) References Cited

U.S. PATENT DOCUMENTS

2004/0158428 A1* 8/2004 Byrd ................. H01F 27/10
702/182
2013/0285486 A1    10/2013 Imanishi et al.

FOREIGN PATENT DOCUMENTS

CN          102 045 903 A        5/2011
DE     10 2006 018 771 A1    10/2007
(Continued)

OTHER PUBLICATIONS

PCT International Search Report and Written Opinion of International Searching Authority dated Jun. 4, 2020 corresponding to PCT International Application No. PCT/EP2019/082426 filed Nov. 25, 2019.

*Primary Examiner* — Charles R Kasenge
(74) *Attorney, Agent, or Firm* — Henry M. Feiereisen LLC (57) ABSTRACT

A conversion device converts an input power into an output power, and gives rise to a power loss. The conversion device is cooled by a coolant circuit in which a coolant flows. A monitoring device determines, using operating data of the conversion device and/or of the coolant circuit, a flow velocity of the coolant and compares the flow velocity with a limit velocity. If the flow velocity reaches or exceeds the limit velocity, the monitoring device resorts to a special reaction. As long as the flow velocity does not reach the limit velocity, the monitoring device resorts either to no reaction or to a normal reaction that is not the same as the special reaction. The monitoring device determines the flow velocity by using a quantity of heat that is to be removed by the coolant per unit time, a local temperature of the conversion device, and an inflow temperature.

9 Claims, 4 Drawing Sheets

(56) References Cited

FOREIGN PATENT DOCUMENTS

| JP | H05227648 A | 9/1993 |
|---|---|---|
| JP | H10225099 A | 8/1998 |

\* cited by examiner

DETERMINING THE FLOW VELOCITY IN A COOLANT CIRCUIT

CROSS-REFERENCES TO RELATED APPLICATIONS

This application is the U.S. National Stage of International Application No. PCT/EP2019/082426, filed Nov. 25, 2019, which designated the United States and has been published as International Publication No. WO 20201126330 A1 and which claims the priority of European Patent Application, Serial No. 18213067.4, filed Dec. 17, 2018, pursuant to 35 U.S.C. 119(a)-(d).

BACKGROUND OF THE INVENTION

The present invention is based on a monitoring method for a coolant circuit in which a coolant flows, by means of which a conversion device giving rise to a power loss is cooled,
- wherein a monitoring device determines, on the basis of operating data of the conversion device and/or of the coolant circuit, a flow velocity at which the coolant flows in the coolant circuit,
- wherein the monitoring device compares the determined flow velocity with a limit velocity,
- wherein the monitoring device resorts to a special reaction if the flow velocity reaches or exceeds the limit velocity,
- wherein the monitoring device resorts either to no reaction at all or to a normal reaction that is not the same as the special action as long as the flow velocity does not reach the limit velocity,
- wherein a local temperature of the conversion device is known to the monitoring device.

The present invention furthermore relates to a computer program for a monitoring device of a conversion device, wherein the computer program comprises machine code which can be executed directly by the monitoring device, wherein the execution of the machine code by the monitoring device causes the monitoring device to carry out a monitoring method of this kind.

The present invention is furthermore based on a monitoring device of a conversion device, wherein the monitoring device is programmed with a computer program of this kind, so that the monitoring device carries out a monitoring method of this kind.

The present invention is furthermore based on a conversion device by means of which an input power supplied to the conversion device is converted into an output power and in the process a power loss is caused, wherein the conversion device has a coolant circuit in which a coolant flows, by means of which the conversion device is cooled, wherein the conversion device has a monitoring device of this kind, which carries out a monitoring method of this kind during operation.

A monitoring method of this kind is known for example from US 2004/0158428 A1. In this monitoring method, the flow velocity is acquired metrologicaily. If the flow velocity is too high or too iow, an alarm is triggered.

Similar subject matter is known from CN 102045903 A, from JP-H10225099 A and from JP H05227648 A.

A monitoring method for a coolant circuit in which a coolant flows, by means of which a conversion device giving rise to a power loss is cooled, is also known from DE 10 2006 018 771 A1. In this monitoring method, an actual temperature of the coolant is acquired metrologicaily. Further variables are acquired and it is determined therefrom whether the conversion device is cooled sufficiently. If this is not the case, then—to the extent possible—the coolant flow is increased so that adequate cooling takes place. If it is no longer possible to increase the coolant flow, the operating state of the conversion device is adapted so that the cooling is adequate.

In conversion devices, an input power supplied to the conversion device is converted into an output power. Examples of conversion devices of this kind are an internal combustion engine and a frequency converter. With an internal combustion engine, chemical energy stored in the fuel used is converted into mechanical energy. With a frequency converter, electrical energy is converted into another kind of electrical energy, for example from a DC voltage into an AC voltage or vice versa. A conversion from an AC voltage of an input frequency into an AC voltage of an output frequency is also possible. In this case, the output frequency is usually different from the input frequency.

In many cases, a significant power loss occurs when the input power is converted into the output power in the conversion device. The power loss must be removed from the conversion device.

In many cases, the respective conversion device has a coolant circuit for removing the power loss, by means of which the conversion device is cooled. The coolant circuit should be as robust and durable as possible. In particular, the coolant circuit should be corrosion-resistant. Corrosion resistance is usually achieved by selecting a suitable material. Examples of such materials are aluminum, stainless steel and copper-nickel-iron alloys. The corrosion resistance of the respective material is usually achieved by means of a thin oxide layer, which forms on the surface of the material.

As long as the cooling liquid is flowing in the coolant circuit at a flow velocity which lies below a predetermined velocity, the coolant circuit works properly. If, however, the flow velocity exceeds the predetermined speed, the oxide layer can be damaged by erosion or abrasion. As a result, the components through which the coolant flows lose their corrosion resistance. Furthermore, the small eroded or abraded particles of the oxide layer can have an abrasive effect and thus lead to further damage, for example in a pump of the coolant circuit. The predetermined velocity depends on the material of the coolant circuit, on the geometry of the coolant circuit and on the coolant, in particular on its chemical composition and in some cases additionally on its temperature.

In the prior art, the product descriptions of conversion devices often specify the operating point of the cooling apparatus (in volumetric flow and nominal pressure) and also the permissible maximum pressure. Furthermore, the coolant itself (for example the proportion of water, inhibitors and antifreeze) is also specified. This approach does not always produce the desired outcome. In particular, a conservative approach, while avoiding damage to the coolant circuit, does not enable the potential power range of the conversion device to be utilized to the full. If on the other hand the potential power range of the conversion device is to be utilized, there is a risk of damage to the coolant circuit associated with higher power values.

The object of the present invention consists in creating possibilities by means of which the potential power range of the conversion device can be utilized without risking damage to the coolant circuit, without having to acquire the flow velocity of the coolant metrologically.

SUMMARY OF THE INVENTION

The object is achieved by a monitoring method as set forth hereinafter. Advantageous embodiments of the monitoring method form the subject matter of dependent claims.

According to the invention, a monitoring method is created for a coolant circuit, wherein a coolant flows in the coolant circuit, by means of which a conversion device giving rise to a power loss is cooled. This method has the features that a quantity of heat to be removed per unit of time by means of the coolant is known to the monitoring device, that an inflow temperature at which the coolant is supplied to the conversion device is sent to the monitoring device as a measurement value, and that the monitoring device determines the flow velocity on the basis of the quantity of heat to be removed per unit of time, the local temperature of the conversion device and the inflow temperature.

The limit velocity usually lies slightly below the predetermined velocity from which the risk of an erosion or abrasion is present. For example, the limit velocity can lie at a high percentage (for example 95%, 98% or 99%) of the predetermined velocity or differ from the predetermined velocity by a predetermined value (for example lie 2 cm/s, 5 cm/s or 10 cm/s therebelow).

It is possible in principle to determine the flow velocity directly. It is however preferably provided that the monitoring device initially determines a thermal resistance of the coolant circuit on the basis of the quantity of heat to be removed per unit of time, the local temperature of the conversion device and the inflow temperature, and then determines the flow velocity on the basis of the determined thermal resistance. The monitoring device can determine the thermal resistance by calculating the difference between the local temperature of the conversion device and the inflow temperature and dividing this temperature by the quantity of heat to be removed per unit of time. The flow velocity can then be determined on the basis of the determined thermal resistance. The flow velocity can be determined for example on the basis of a characteristic curve. The characteristic curve in other words the flow velocity as a function of the thermal resistance—can be determined for example arithmetically on the basis of geometry data of the coolant circuit or by means of experiments.

The monitoring device is preferably connected to a control device for the conversion device. Alternatively, the monitoring device can form a physical unit with the control device. Further alternatively, the monitoring device can be identical to the control device. In all three cases, it is possible for the monitoring device to determine the quantity of heat to be removed and/or the local temperature of the conversion device on the basis of the temporal sequence of an actuation state with which the control device actuates the conversion device.

Alternatively, it is possible for the monitoring device to directly receive values for the quantity of heat to be removed and/or the local temperature of the conversion device, for example corresponding measurement values.

It is possible for the limit velocity to be specified as a fixed value. Alternatively, it is possible for the monitoring device to determine the limit velocity on the basis of a temperature of the cooling liquid.

The object is furthermore achieved by a computer program for a monitoring device of a conversion device as set forth hereinafter. According to the invention, a computer program of the type mentioned in the introduction is configured such that the execution of the machine code by the monitoring device causes the monitoring device to carry out a monitoring method according to the invention.

The object is furthermore achieved by a monitoring device as set forth hereinafter. According to the invention, the monitoring device is programmed with a computer program according to the invention, so that the monitoring device carries out a monitoring method according to the invention during operation.

The object is furthermore achieved by a conversion device as set forth hereinafter. An advantageous embodiment of the conversion device according to the invention is the subject matter of [[the]] a dependent claim.

According to the invention, the conversion device has a monitoring device according to the invention, which carries out a monitoring method according to the invention during operation.

The conversion device is preferably embodied as a frequency converter. This application represents a particularly typical and critical use case.

BRIEF DESCRIPTION OF THE DRAWING

The above-described properties, features and advantages of this invention as well as the manner in which they are achieved will become clearer and more comprehensible in conjunction with the following description of the exemplary embodiments, which are explained in more detail in conjunction with the drawings, in the drawings, in schematic representation.

DETAILED DESCRIPTION OF PREFERRED EMBODIMENTS

Figure 1:
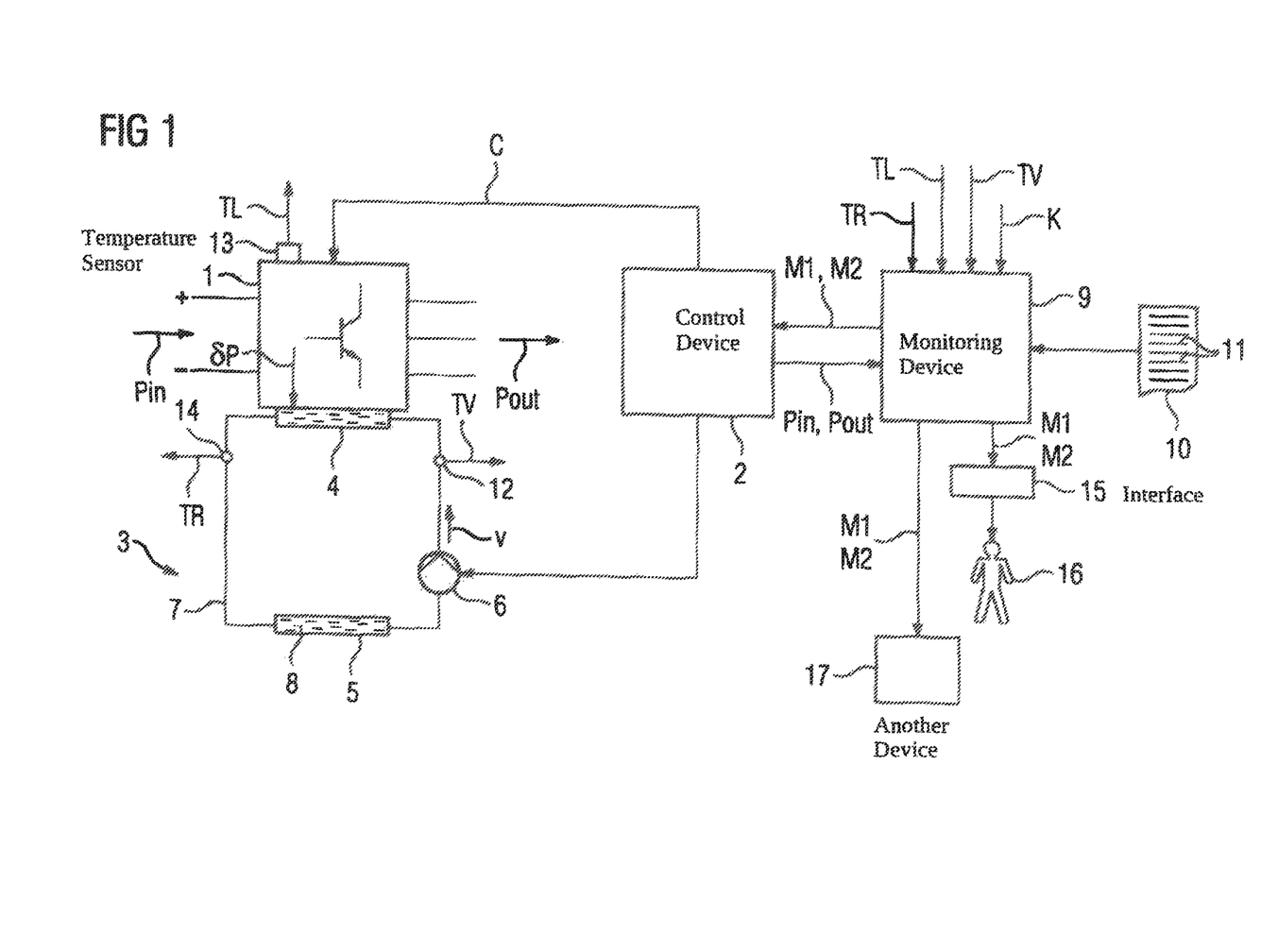
FIG. 1 shows a conversion device.

According to FIG. 1, by means of a conversion device 1 an input power Pin supplied to the conversion device 1 is converted into an output power Pout, which is output by the conversion device 1. The output power Pout is lower than the input power Pin. The difference between the input power Phi and the output power Pout corresponds to a power loss δP caused by the conversion device 1. The conversion device 1 is embodied as a frequency converter in accordance with the representation in FIG. 1. By means of the frequency converter, it is possible for example for a DC voltage (identifiable by "+" and "−" on the input side of the conversion device 1) to be converted into an AC voltage (specifically into a three-phase AC voltage, identifiable by the three lines on the output side of the conversion device 1). However, other embodiments of the conversion device 1 are also possible. In particular, the frequency converter could also work in the reverse direction or the conversion device 1 could be embodied differently, for example as an internal combustion engine.

In many cases, the conversion device 1 is controlled by means of a control device 2. In such cases, the control device 2 transmits corresponding control signals C to the conversion device 1. The control signals C determine the respective actuation state Z with which the control device 2 actuates the conversion device 1.

The conversion device 1 has a coolant circuit 3. The coolant circuit 3 usually comprises a heat sink 4, a heat exchanger 5, a pump 6 and the associated lines 7 between the heat sink 4, the heat exchanger 5 and the pump 6. A coolant 8, by means of which the conversion device 1 is cooled, flows in the coolant circuit 3. The coolant 8 is often water, to which certain additives can be added. A quantity of heat is removed from the conversion device 1 by means of the heat sink 4. The quantity of heat corresponds essentially to the power loss δP. In the following, the quantity of heat to be removed is therefore equated with the power loss δP. The required quantity of heat is removed from the coolant circuit 3, for example emitted into the surrounding area, by means of the heat exchanger 5. The pump 6 ensures that the coolant 8 is guided in sufficient quantity from the heat sink 4 to the heat exchanger 5 and from there back to the heat sink 4. The pump 6 is often a regulated pump. If this is the case, the pump 6 is controlled by the control device 2.

The conversion device 1 furthermore has a monitoring device 9. The monitoring device 9 is programmed with a computer program 10. The computer program 10 comprises machine code 11 which can be executed directly by the monitoring device 9. On account of the programming of the monitoring device 9 with the computer program 10 and the corresponding execution of the machine code 11 by the monitoring device 9, it is achieved that the monitoring device 9 carries out a monitoring method, which is explained in more detail below in conjunction with FIG. 2.

Figure 2:
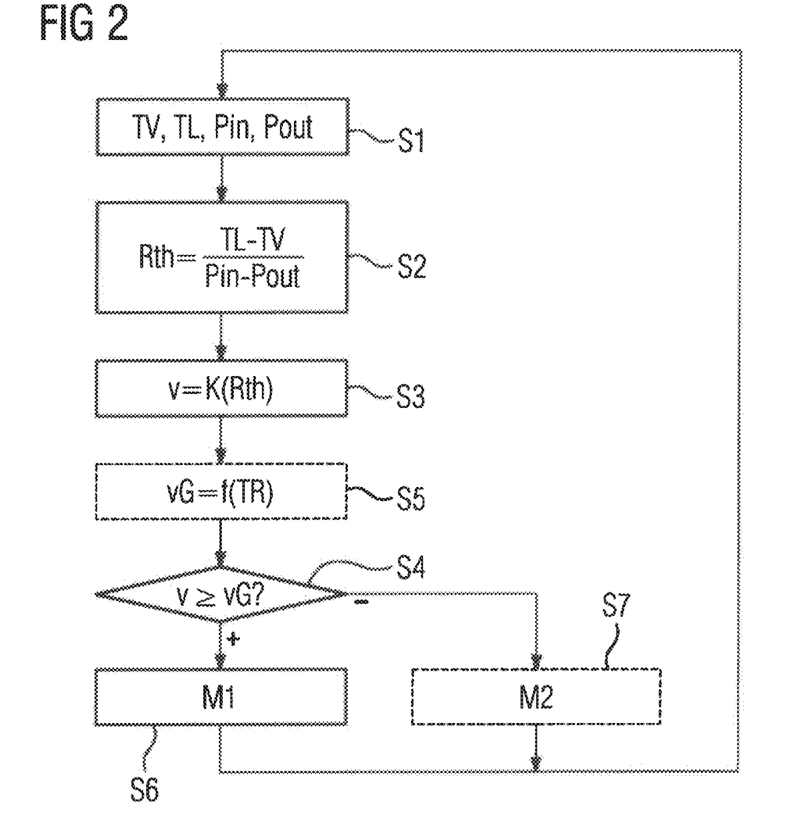
FIG. 2 shows a flow diagram.

According to FIG. 2, in a step S1 the monitoring device 9 receives operating data of the conversion device 1 and/or of the coolant circuit 3.

According to the invention, the operating data comprises at least an inflow temperature TV of the coolant circuit 3, in other words the temperature at which the coolant 8 is supplied to the heat sink 4. The inflow temperature TV is usually acquired metrologically by means of a corresponding temperature sensor 12. Furthermore, a local temperature TL of the conversion device 1 is supplied to the monitoring device 9 as a further item of operating data. The local temperature TL—in the case of a frequency converter for example the junction temperature of the semiconductors—is usually acquired metrologically by means of a corresponding temperature sensor 13. Measurement values or arithmetically calculated values for the input power Pin and the output power Pout or the power loss δP and thus, as a result, characteristic values for the quantity of heat to be removed per unit of time can be supplied to the conversion device 9 as further operating data.

In a step S2, the monitoring device 9 can for example initially determine a thermal resistance Rth. The monitoring device 9 can determine the thermal resistance Rth in accordance with the representation in FIG. 2 in particular by calculating the difference between the local temperature TL and the inflow temperature TV and dividing this difference by the difference between the input power Pin and the output power Pout. The difference between the input power Pin and the output power Pout corresponds, as already mentioned, to the power loss δP and thus essentially to the quantity of heat to be removed per unit of time. In a step S3, the monitoring device 9 can then determine the flow velocity v on the basis of the determined thermal resistance Rth.

Figure 3:
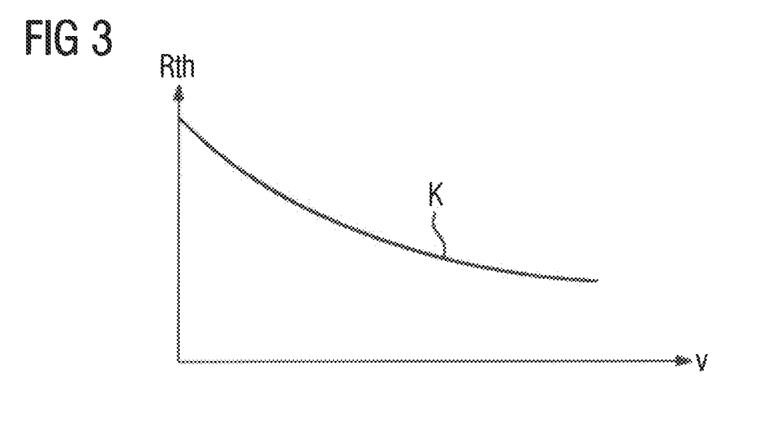
FIG. 3 shows a characteristic curve.

The determination of the flow velocity v on the basis of the determined thermal resistance Rth can take place for example as shown in FIG. 3 on the basis of a characteristic curve K, known to the monitoring device 9, which describes the functional sequence of the flow velocity v as a function of the thermal resistance Rth (or vice versa). The characteristic curve K can be determined for example on the basis of geometry data of the coolant circuit 3 or on the basis of a measurement series. From the representation of the characteristic curve K in FIG. 3, it can also be seen in particular that the thermal resistance Rth tends toward a constant value at a high volumetric flow and thus a high flow velocity v, while it increases at lower volumetric flows.

In a step S4, the monitoring device 9 compares the determined flow velocity v with a limit velocity vG.

It is possible for the limit velocity vG of the monitoring device 9 to be specified as a fixed value. Preferably, however, the monitoring device 9 determines the limit velocity vG in a step S5 disposed upstream of step S4. In this case, the monitoring device 9 determines the limit velocity vG on the basis of a temperature TR of the cooling liquid 8. The monitoring device 9 also evaluates the material of the coolant circuit 3 and the chemical composition of the coolant 8 in order to determine the limit velocity vG. However, these variables must be specified to the monitoring device 9 only once, as they do not change during operation of the conversion device 1 and the coolant circuit 3.

The temperature which occurs in the return part of the coolant circuit 3, in other words after the coolant 8 has flowed through the heat sink 4, is preferably used as the temperature TR of the cooling liquid 8. The temperature TR, if it is evaluated, is acquired by means of a corresponding temperature sensor 14. Step S5 is drawn with dashed lines in FIG. 2 as it is only optionally present. Alternatively, the inflow temperature TV can also be used. The use of the return temperature TR is however to be preferred, since the return temperature TR lies above the inflow temperature TV and the limit velocity vG—if there is any temperature dependence at all of the limit velocity vG—is typically lower at higher temperatures than it is at lower temperatures.

If the monitoring device 9 establishes in step S4 that the flow velocity v reaches or exceeds the limit velocity vG, the monitoring device 9 proceeds to a step S6. In step S6, the monitoring device 9 resorts to a special reaction. For example, it can issue an alarm message M1. The alarm message M1 can be output for example via a human-machine interface 15 to an operator 16. Alternatively or in addition, an output to the control device 2 is possible. In this case, the control device 2 can for example adjust an actuation of the pump 6 so that the flow velocity v is reduced. If necessary, the control device 2 can also adjust the actuation of the conversion device 1 so that a lower power loss δP occurs. Alternatively or in addition, an output to another device 17 is possible, for example a remote computer device which is not integrated into the control of the conversion device 1 and the pump 6. From step S6, the monitoring device 9 returns to step S1.

If, on the other hand, the monitoring device 9 establishes in step S4 that the flow velocity v does not reach the limit velocity vG, it is possible for the monitoring device 9 to return from step S4 directly to step S1. In this case, the monitoring device 9 resorts to no reaction at all. For example, the alarm message M1 is not output. Alternatively, it is possible for the monitoring device 9 to proceed to a step S7 in the event that the flow velocity v does not reach the limit velocity vG. Because step S7 is only optionally present, it is drawn like step S5 with dashed lines in FIG. 2.

If step S7 is present, the monitoring device 9 resorts to a normal reaction in step S7. For example, the monitoring device 9 can issue an OK message M2. The OK message M2 can be output in the same manner as the alarm message M1 to the control device 2, via the human-machine interface 15 to the operator 16 and/or to the other device 17.

The normal reaction is a reaction that is different from the special reaction. If for example the output of the alarm message 111 causes a signal lamp of the human-machine interface 15 to be actuated such that the signal lamp flashes red, the output of the OK message M2 can consist in the signal lamp flashing permanently green. Other approaches are of course also possible.

A further possible embodiment of the conversion device 1 and the corresponding mode of operation of the monitoring device 9 are explained below in conjunction with FIGS. 4 and 5.

Figure 4:
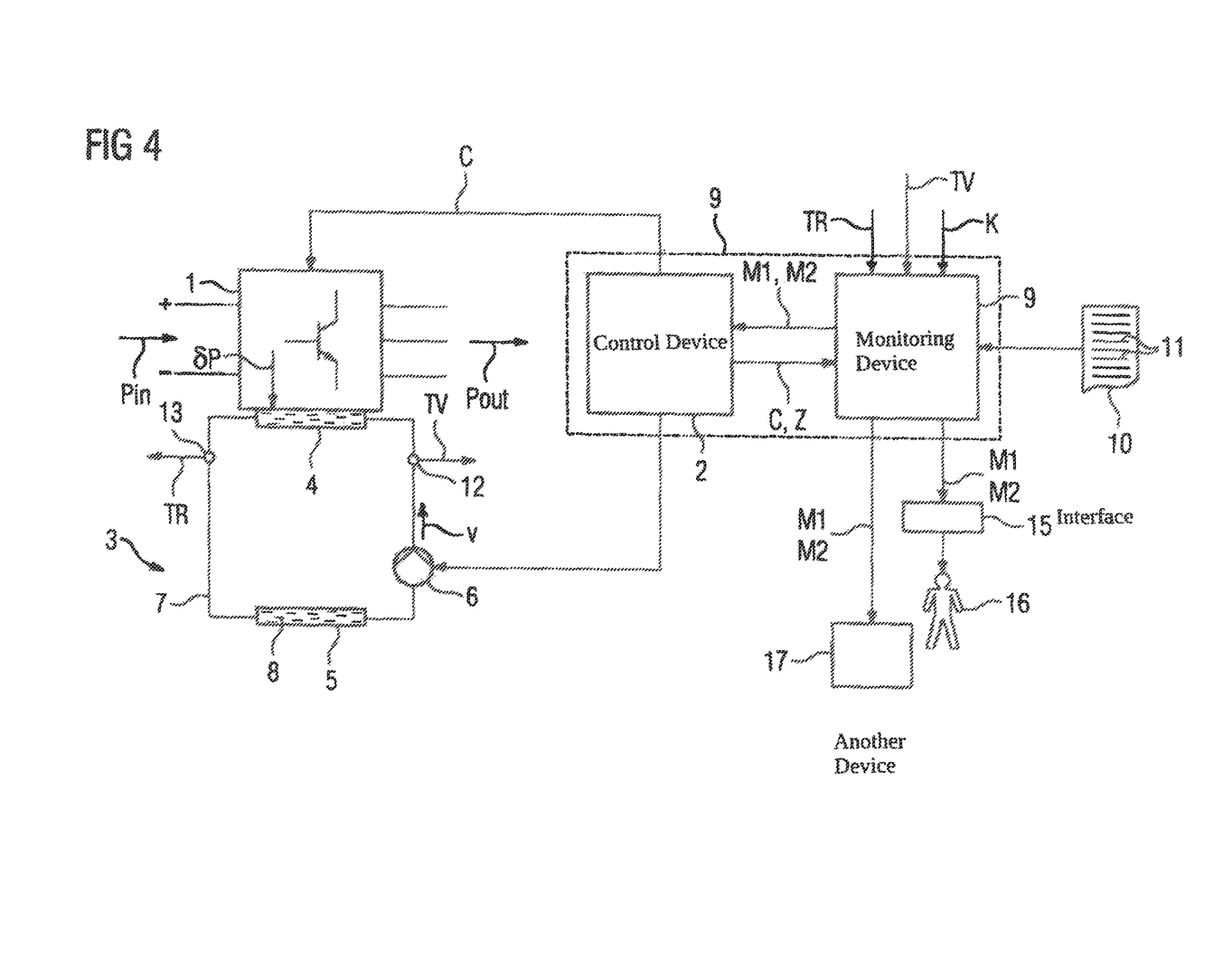
FIG. 4 shows a further conversion device.
Figure 5:
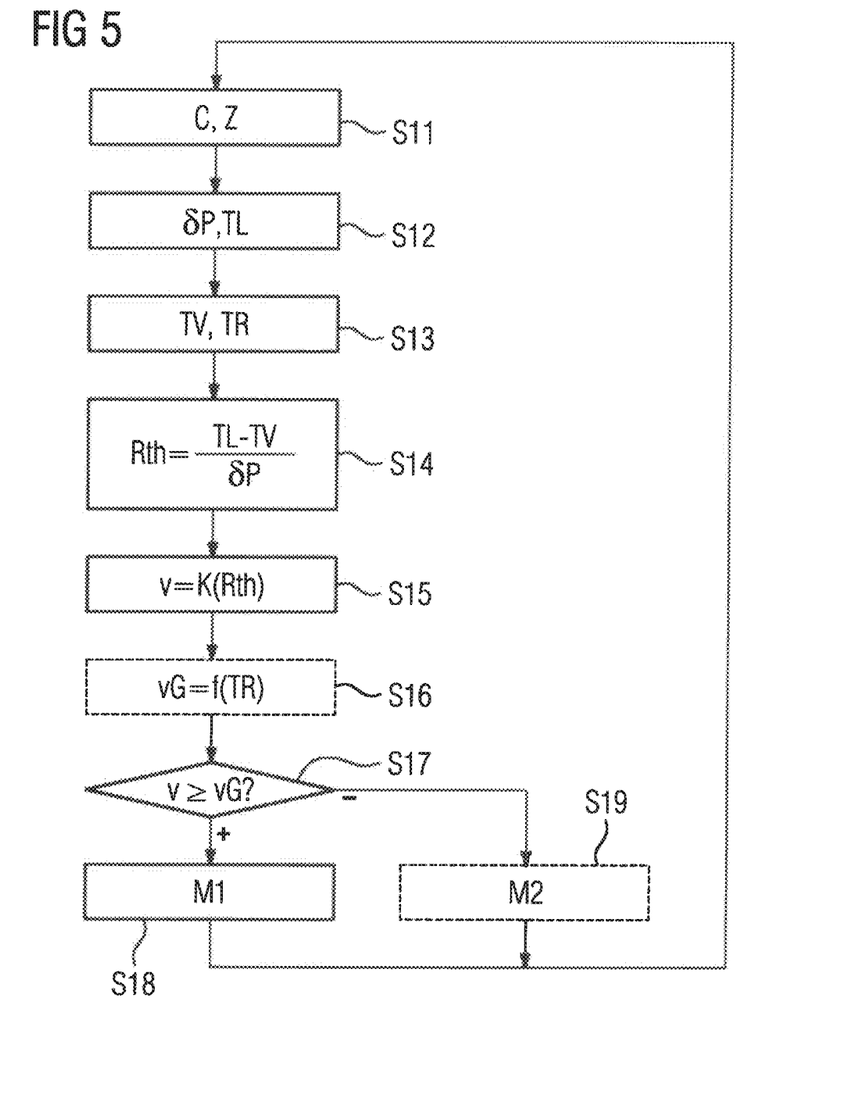
FIG. 5 shows a further flow diagram.

In the embodiment according to FIG. 4, as indicated by a dashed border in FIG. 4, one of the three following possibilities is realized:
 the monitoring device 9 is connected to the control device 2 or
 the monitoring device 9 forms a physical unit with the control device 2 or
 the monitoring device 9 is identical to the control device 2.

In these cases, it is possible for the control device 2 to transmit the data known to it to the monitoring device 9. Specifically, the control device 2 in this case transmits the control signals C or the actuation state Z resulting therefrom to the monitoring unit 9. The monitoring device 9 receives the control signals C or the actuation state Z according to FIG. 5 in a step S11.

In a step S12, the monitoring device 9 in this case determines the power loss δP (or the quantity of heat to be removed) and/or the local temperature TL of the conversion device 1 on the basis of the control signals C or the actuation state Z. If necessary, the monitoring device 9 can in this context also consider preceding control signals C or actuation states Z so that as a result it determines the power loss δP (or the quantity of heat to be removed) and/or the local temperature TL of the conversion device 1 on the basis of the temporal sequence of the actuation state Z.

In a step S13, the monitoring device 9—as in step S1 from FIG. 2—receives the inflow temperature TV (and if relevant also the return temperature TR).

Step S13 is followed by steps S14 to S19. Steps S14 to S19 correspond 1:1 to steps S2 to S7 of FIG. 2. Reference is therefore made to the corresponding explanations for steps S2 to S7.

The present invention has many advantages. In particular, the current flow velocity v can be determined online and almost in real time. On this basis, safety-related reactions can be initiated to the extent required. Existing components can generally be used to determine the required measurement values. The oxide layer of the coolant circuit 3 can be protected and thus the service life of the coolant circuit 3 significantly extended.

Although the invention has been illustrated and described in greater detail with the preferred exemplary embodiment, the invention is not restricted by the examples disclosed and other variations can be derived therefrom by the person skilled in the art without departing from the protective scope of the invention.

What is claimed is:

1. A method for monitoring a coolant circuit, the method comprising:
 cooling a conversion device giving rise to a power loss with a coolant flowing in the coolant circuit;
 sending to a monitoring device as a measurement value an inflow temperature at which the coolant is supplied to the conversion device;
 determining with the monitoring device a flow velocity at which the coolant flows in the coolant circuit based on operating data of the conversion device and/or the coolant circuit, a quantity of heat to be removed per unit of time by the coolant known to the monitoring device, a local temperature of the conversion device known to the monitoring device, and the inflow temperature;
 comparing with the monitoring device the determined flow velocity with a limit velocity;
 resorting with the monitoring device to a special reaction when the determined flow velocity reaches or exceeds the limit velocity; and
 resorting with the monitoring device to either no reaction at all or to a normal reaction that is not the same as the special reaction as long as the determined flow velocity does not reach the limit velocity.

2. The method of claim 1, further comprising:
 initially determining with the monitoring device a thermal resistance of the coolant circuit based on the quantity of heat to be removed per unit of time, the local temperature of the conversion device, and the inflow temperature; and
 determining with the monitoring device the flow velocity based on the determined thermal resistance.

3. The method of claim 1, further comprising determining with the monitoring device a quantity of heat to be removed and/or the local temperature of the conversion device based on a temporal sequence of an actuation state with which a control device actuates the conversion device, wherein the monitoring device is connected to the control device for the conversion device or the monitoring device forms a physical unit with the control device or the monitoring device is identical to the control device.

4. The method of claim 3, further comprising receiving with the monitoring device values for the quantity of heat to be removed and/or the local temperature of the conversion device.

5. The method of claim 1, further comprising determining with the monitoring device the limit velocity based on a temperature of the coolant.

6. A computer program product for a monitoring device of a conversion device, the conversion device giving rise to a power loss and cooled with a coolant flowing in a coolant circuit, the computer program product embodied on a tangible, non-transitory computer readable medium, the computer program product comprising a computer program with machine code, wherein when the machine code is executed by the monitoring device, the monitoring device carries out the steps of:
 receiving as a measurement value an inflow temperature at which the coolant is supplied to the conversion device,
 determining a flow velocity at which the coolant flows in the coolant circuit based on operating data of the conversion device and/or the coolant circuit, a quantity of heat to be removed per unit of time by the coolant known to the monitoring device, a local temperature of the conversion device known to the monitoring device, and the inflow temperature,
 comparing the determined flow velocity with a limit velocity,
 resorting to a special reaction when the determined flow velocity reaches or exceeds the limit velocity, and resorting to either no reaction at all or to a normal reaction that is not the same as the special reaction as long as the determined flow velocity does not reach the limit velocity.

7. A monitoring device of a conversion device, the conversion device giving rise to a power loss and cooled with a coolant flowing in a coolant circuit, wherein the monitoring device is programmed with and executes the computer program of claim 6 during operation of the monitoring device.

8. A conversion device supplied with an input power, the input power converted by the conversion device into an output power causing a power loss, the conversion device comprising:
- a coolant circuit in which a coolant flows, the coolant circuit cooling the conversion device; and
- a monitoring device configured to:
    - receive as a measurement value an inflow temperature at which the coolant is supplied to the conversion device;
    - determine a flow velocity at which the coolant flows in the coolant circuit based on operating data of the conversion device and/or the coolant circuit, a quantity of heat to be removed per unit of time by the coolant known to the monitoring device, a local temperature of the conversion device known to the monitoring device, and the inflow temperature;
    - compare the determined flow velocity with a limit velocity;
    - resort to a special reaction when the determined flow velocity reaches or exceeds the limit velocity; and
    - resort to either no reaction at all or to a normal reaction that is not the same as the special reaction as long as the determined flow velocity does not reach the limit velocity.

9. The conversion device of claim 8, wherein the conversion device is embodied as a frequency converter.

* * * * *